United States Patent [19]
Yamamoto

[11] Patent Number: 5,779,388
[45] Date of Patent: Jul. 14, 1998

[54] PRINTED CIRCUIT BOARD RETAINER

[75] Inventor: Albert K. Yamamoto, Huntington Beach, Calif.

[73] Assignee: Fairchild Holding Corp., Chantilly, Va.

[21] Appl. No.: 725,806

[22] Filed: Oct. 4, 1996

[51] Int. Cl.$^6$ ........................................... B25G 3/00
[52] U.S. Cl. .................. 403/405.1; 403/374; 403/409.1; 361/741; 361/756
[58] Field of Search ......................... 361/740, 741, 361/747, 756, 759, 801, 802, 807, 809; 403/374, 409.1, 405.1, DIG. 7, 326, 327

[56] References Cited

U.S. PATENT DOCUMENTS

| | | | |
|---|---|---|---|
| 4,318,157 | 3/1982 | Rank et al. | 361/386 |
| 4,354,770 | 10/1982 | Block | 361/806 X |
| 4,480,287 | 10/1984 | Jensen | 361/388 |
| 4,571,966 | 2/1986 | Lopez Jr. | 70/232 |
| 4,775,260 | 10/1988 | Kecmer | 403/409.1 |
| 4,824,303 | 4/1989 | Dinger | 403/374 X |
| 5,090,840 | 2/1992 | Cosenza | 403/409.1 |
| 5,156,647 | 10/1992 | Ries | 403/409.1 X |
| 5,577,415 | 11/1996 | Reasoner | 403/DIG. 7 |

*Primary Examiner*—Kenneth J. Dorner
*Assistant Examiner*—William L. Miller
*Attorney, Agent, or Firm*—Irving Keschner

[57] ABSTRACT

An improved printed circuit board wedge assembly having a center segment with sloped surfaces at its opposite ends and two end wedge segments having surfaces that abut against opposite ends of the center wedge segment. A drive shaft has a first ratchet member at one end, the first ratchet member engaging a second ratchet member having an elongated hex shaped member extending therefrom. The hex member is adapted to slide in a hex socket formed in an adjacent sleeve member. The drive shaft, having a threaded portion, extends lengthwise through a channel in the center wedge segment and connects together the two end wedge segments. A retaining ring is provided for captivating the driver portion of the assembly to the wedge segments. When the drive shaft is rotated in one direction, the two end wedge segments, together with the shaft, move transversely to the center wedge segment to fasten the PCB in place. The hexagonal shaped member transmits torque from an external drive to the first ratchet member. A snap ring is utilized to captivate the wedge segments and prevent them from falling off the shaft when in the relaxed position. A leaf spring is provided to maintain the individual end wedge segments longitudinally aligned with the center wedge segment when the shaft is loosened.

2 Claims, 3 Drawing Sheets

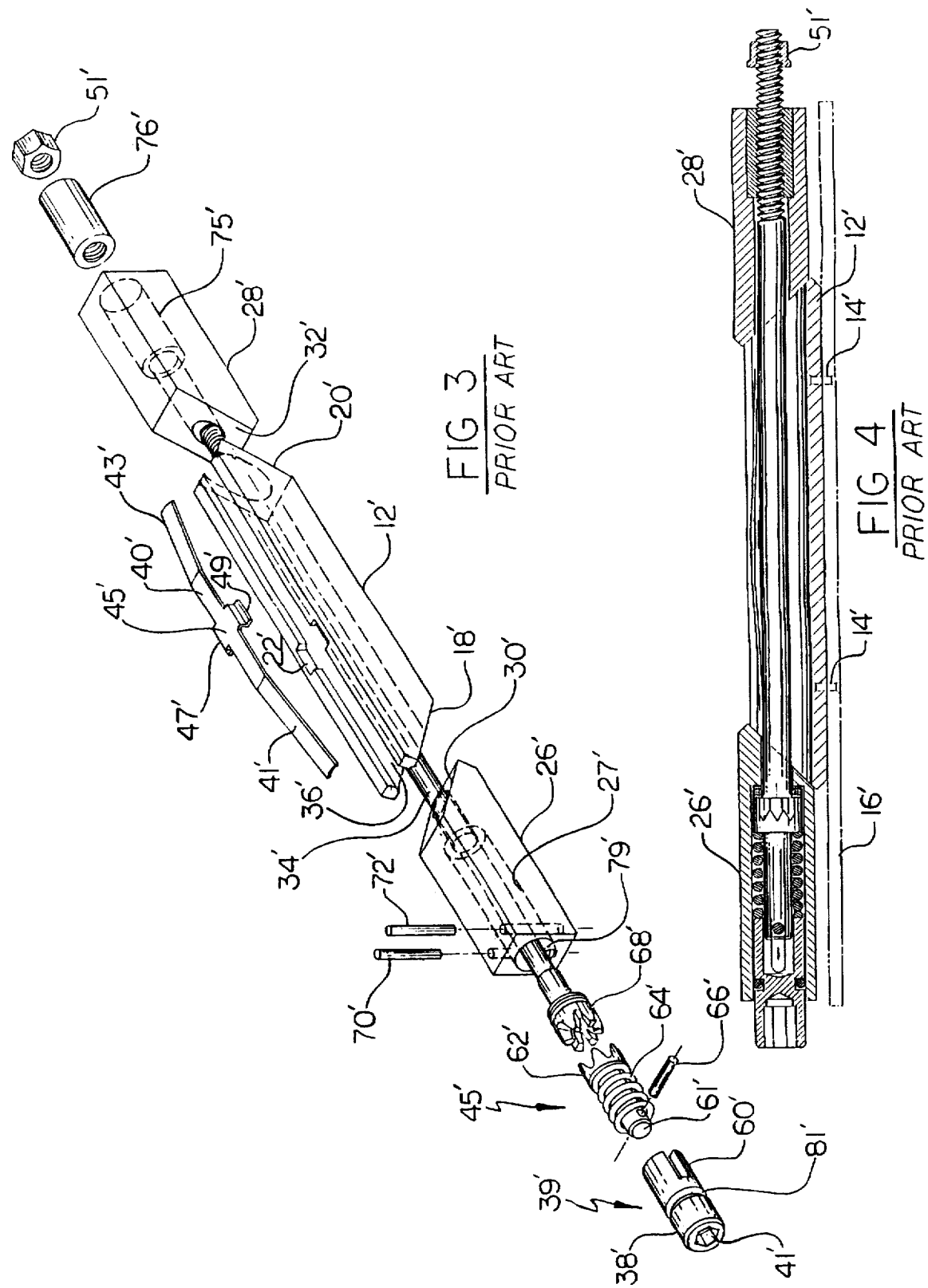

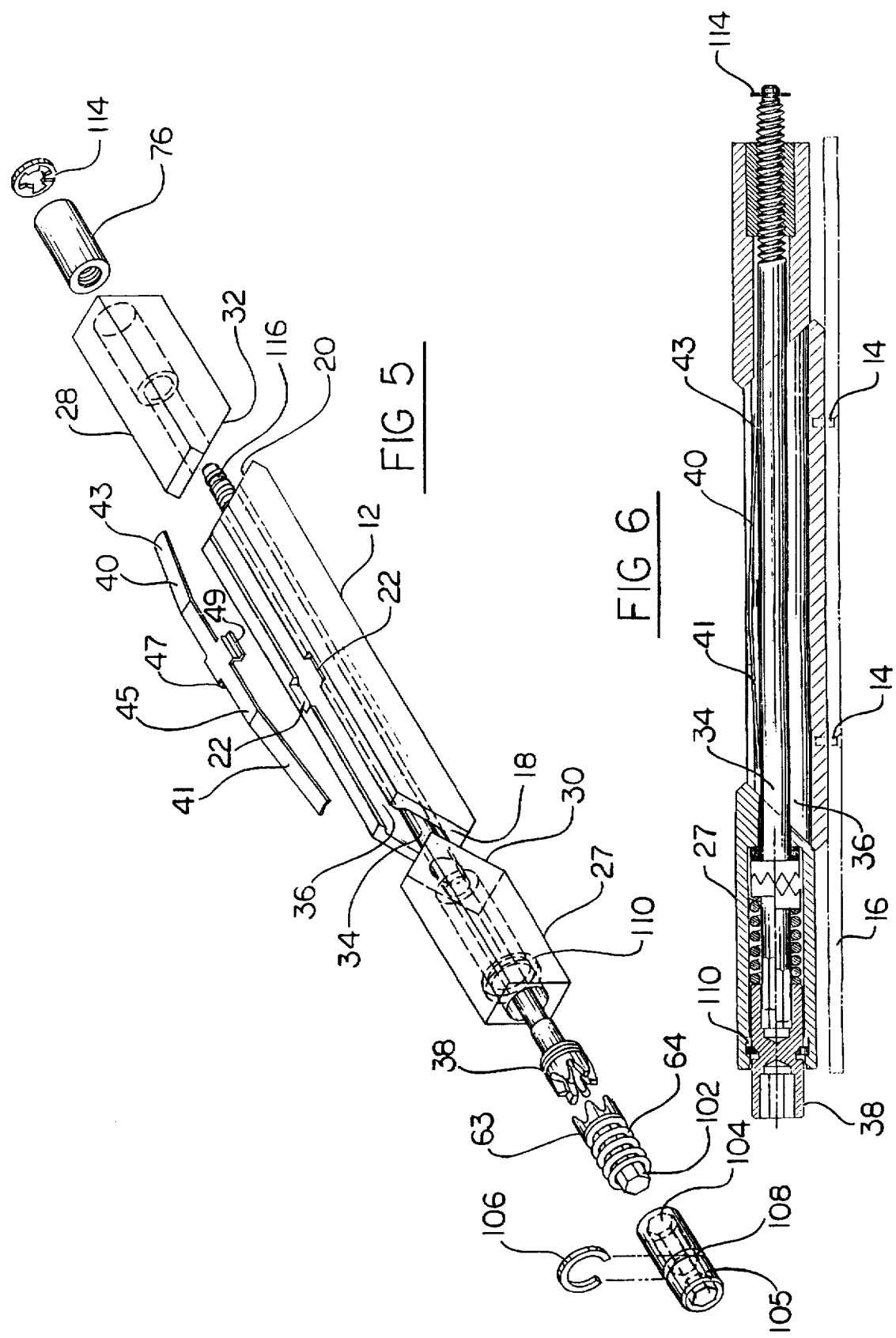

1
PRINTED CIRCUIT BOARD RETAINER

BACKGROUND OF THE INVENTION

1. Field of the Invention

The present invention provides an improved printed circuit board mounting apparatus that includes an elongated wedge assembly that expands transversely to fasten the board in place and which utilizes a resilient member as a part of the assembly to align the wedge segments.

2. Description of the Prior Art

Elongated wedge assemblies that expands transversely to fasten a printed circuit board (PCB) in place have been available in the prior art. For example, U.S. Pat. No. 4,775,260 discloses such a device which includes a clutch mechanism to limit the maximum torque that can be applied to the positioning screw. A biasing spring is provided to bias the wedge segments into longitudinal alignment. Although the device disclosed in the '260 patent has been commercially successful since its introduction into the marketplace, the manufacturing process is relatively time consuming and costly. What is desired is to provide an elongated wedge assembly wherein the manufacturing process therefore is accomplished more efficiently, thus reducing the manufacturing cost of the device.

SUMMARY OF THE PRESENT INVENTION

The present invention provides an improved printed circuit board wedge assembly having a center segment with sloped surfaces at its opposite ends and two end wedge segments having surfaces that abut against opposite ends of the center wedge segment. A drive shaft, having a first ratchet member at one end, the first ratchet member engaging a second ratchet member having a elongated hex shaped member extending therefrom. The hex member is adapted to slide in a hex socket sleeve formed in an adjacent sleeve member. The drive shaft, having a threaded portion, extends lengthwise through a channel in the center wedge segment and connects together the two end wedge segments. A retaining ring is provided for captivating the driver portion of the assembly to the wedge segments. When the drive shaft is rotated in one direction, the two end wedge segments, together with the shaft, move transversely to the center wedge segment to fasten the PCB in place. The hexagonal shaped member transmits torque from an external drive to the first ratchet member. A snap ring is utilized to captivate the wedge segments and prevent them from falling off the shaft when in the relaxed position. A leaf spring is provided to maintain the individual end wedge segments longitudinally aligned with the center wedge segment when the shaft is loosened.

The present invention thus provides an improved clutch mechanism containing PCB wedge assembly wherein the manufacturing and assembly process is accomplished more rapidly, thus reducing the costs, including labor costs, associated with the fabrication therewith. The improved assembly utilizes a hexagonal drive member sliding in a hex recess, or socket, to transmit torque from an external hex drive to the driver ratchet; a retaining ring to rapidly captivate the drive assembly within one of the end segments and a snap ring to captivate the wedge segments to the drive shaft.

DESCRIPTION OF THE DRAWINGS

For a better understanding of the invention as well as other objects and further features thereof, reference is made to the following description which is to be read in conjunction with the accompanying drawing wherein:

FIG. 3 is an exploded view of a prior art locking wedge assembly;

FIG. 4 is a cross-sectional elevational view of the prior art locking wedge assembly of FIG. 3 shown fastened to a printed circuit board;

FIG. 5 illustrates an exploded view of the improved version of the locking wedge assembly shown in FIG. 1; and FIG. 6 is a cross-sectional elevational view of the locking wedge assembly of FIG. 5 shown fastened to a printed circuit board.

DESCRIPTION OF THE INVENTION

Figure 1:
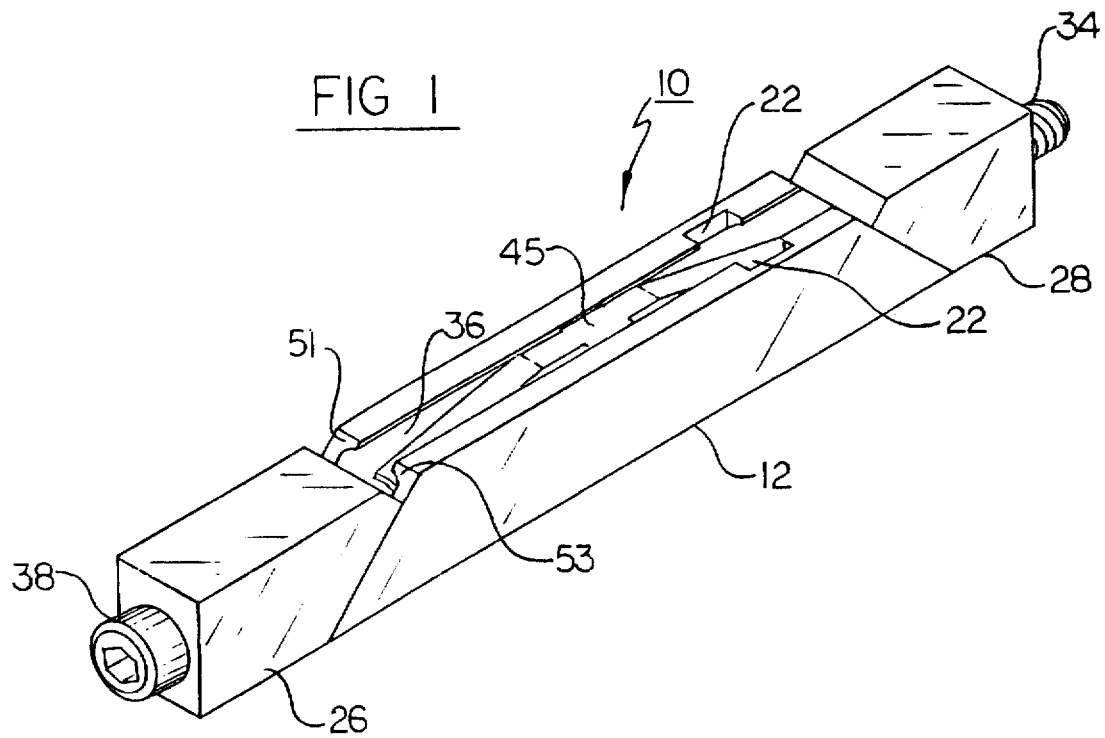
FIG. 1 is a perspective view of a locking wedge assembly in accordance with the teachings of the present invention.

With reference now to the drawings, there is shown a locking wedge assembly 10 formed in accordance with the teachings of the present invention, for use in retaining a printed circuit board (PCB) in an elongated slot formed in a chassis or a rack, not shown in the drawings.

The slot is of greater width than the thickness of the PCB, so as to receive both the edge of the PCB and the locking wedge assembly 10. The assembly includes an elongated center wedge segment 12 which can be fixed by screws or rivets 14 to the edge 16 of the PCB (FIG. 6). Center wedge segment 12 includes sloped surfaces 18 and 20 at its opposite ends. Slots, or openings, 22 are formed in center wedge segment 12 as illustrated. Cooperating first and second end wedge segments 26 and 28 include sloped surfaces 30 and 32, respectively, that abut against sloped surface 18 and 20, respectfully, of center wedge segment 12. A wedge operating drive shaft 34 extends through elongated channel, or groove 36 in the center wedge segment 12 to interconnect end wedge segments 26 and 28. Shaft head 38 bears against second end wedge segment 26. The remote end of shaft 34 projects a short distance beyond the end wedge segment 28 as illustrated as is captivated to the assembly by snap ring 114 (FIG. 5). Rotating drive shaft 34 in one direction (e.g., clock-wise) draws the two end wedge segments 26 and 28 toward each other, causing the end wedges and the screw to deflect transversely relative to the center wedge 12. This increases the assembly's effective transverse width and, thus, locks the PCB within the slot. Conversely, rotating drive shaft 34 in the opposite direction moves the two end wedge segments 26 and 28 apart from each other, to loosen the assembly and permit removal of the PCB from the slot.

The assembly further includes a leaf type biasing spring 40 comprising elongated members, or leafs, 41 and 43, base member 45 and tabs, or flanges, 47 and 49. After longitudinal operating stud 34 is positioned in channel 36 formed in center segment 12, flange 47 and 49 of spring 40 extend into slots, or recesses 22, enabling tabs 47 and 49 thereof to be positioned within channel 36. The leaf spring 40 is inserted into center segment 12 in the following manner:

Leaf spring 40 is positioned over center segment 12 with tabs 47 and 49 above slots 22, elongated members 41 and 43 extending in the direction of channel 36.

The user then pushes down on spring 40 in the middle of base member 45 such that tabs 47 and 49 are positioned in corresponding openings 22, the tabs engaging the underside of lip portions 51 and 53. When depressed, spring 40 slides towards wedge section 28. Spring 40 is positioned anywhere within center segment 12 so that leafs 41 and 43 are resting on top of drive shaft 34.

Spring 40 is removed by lifting it clear of wedge segment 28 and sliding it in that direction until tabs 47 and 49 pop up through slots 22.

The locking wedge assembly of the present invention is an improvement of the locking wedge assembly described and claimed in U.S. Pat. No. 4,775,260, the teachings of which that are necessary for an understanding of the invention being incorporated herein by reference.

Figure 2:
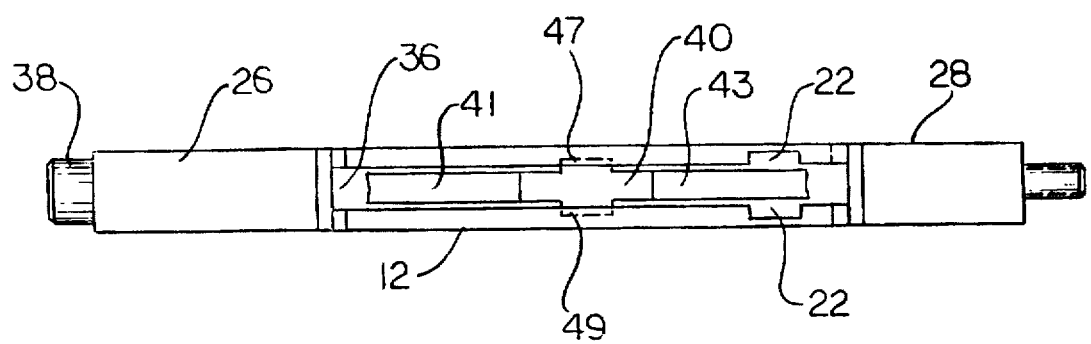
FIG. 2 is a plan view of the locking wedge assembly of FIG. 1.

To more clearly set forth the improvements provided by the present invention, some details of the commercially available Wedg-Tite® locking wedge assembly (retainer) sold by the Fairchild Corporation, Chantilly, Va. is described with reference to FIGS. 3 and 4. It should be noted that elements of the prior art assembly corresponding to the improved version shown in FIGS. 1, 2, 5 and 6 are identified by the same reference numerals, but with prime notations.

The head of the drive shaft 34' is part of a clutch assembly 45' positioned within a cylindrical recess 27' in the end wedge segment 26'. The remote end of the shaft 34' engages a bore 75' in end wedge segment 28'. A threaded collar 76' is located within bore 75' to receive the threaded portion of shaft 34'. As noted hereinabove, rotating the shaft in one direction (e.g., clockwise) draws the two end wedge segments toward each other, while rotating it in the opposite direction moves the two end wedge segments apart from each other.

Clutch assembly 45' limits the maximum forward torque that can be applied to shaft 34'. This, in turn, controls the wedge assembly's clamping force, and thus prevents possible physical or functional damage to the PCB being clamped.

The clutch assembly, or operator, 45' includes first and second clutch heads 62' and 68', a compression spring 64' and a driver 39', all located within a cylindrical recess 79' in end wedge segment 26' as shown in FIG. 4. The second clutch head 68' forms the head of the shaft 34' and the first clutch head 62' is urged into contact with the second clutch head by the compression spring 64'.

The driver 39' includes enlarged head 38' with a hexagonal recess 41' sized to receive a conventional hex key wrench (not shown) and slotted sleeve 60'. Shaft 61' projects through the compression spring 64' such that its mating roll pin 66' engages the slot in sleeve 60'.

In use, a hex key wrench (not shown) engages the hex recess 41' of the driver 39' to rotate both the driver and the first clutch head 62'. Because the compression spring 64' biases the first clutch head 62' against the second clutch head 68', this rotation is coupled through to the second clutch head 68' and, thus, to the shaft 34'. A clockwise rotation draws the two end wedge segments 26' and 28' toward each other, to fasten the PCB in place. The operation of the driver is described in the '260 patent and will not be described herein for the sake of brevity.

A nut 51' is secured to the remote end of screw 34' to prevent an inadvertent disassembly of the wedges 12', 26' and 28' by excessively unthreading the shaft 34'.

As set forth hereunder, biasing spring 40' is configured to bias the shaft, or screw, 34' away from the top wall of the center wedge segment 12', i.e., toward the PCB. This biases the two end wedge segments 26' and 28' into longitudinal alignment with the center wedge.

Rollpins 70' and 72' are mounted within end segment 26' and positioned within groove 81', formed in driver 39' to captivate the driver 39' within wedge segment 26'. Typically, the rollpins, of a relatively small diameter, are driven by a hammer into position. The problem with using the rollpins is that the repetitive hex force applied to tighten/remove the wedge lock assembly and the force of spring 64' tends to push the pins outwardly over an extended period of use.

The current Wedg-Tite wedge assembly also includes a dowel pin 66' which slides in slot 60' to transmit torque from the external hex drive to the driving ratchet 62'. Forming slot 60' in the operator mechanism is time consuming and costly. The wedge segments, as noted hereinabove, are captivated on the drive shaft 34' by using lock nut 51' (or a cross-pin, not shown) when the wedge segments are in a relaxed position. The use of nut 51' (or a cross-pin) for captivation purposes adds to the time and cost of manufacturing the wedge lock assembly.

In accordance with the teachings of the present invention as shown in FIGS. 5 and 6, a hexagonal drive shaft 102 is provided to slide in hex socket recess 104 formed in sleeve 105 to transmit torque from the external hex drive (not shown) to the driving ratchet 63. The operator (defined as components positioned in wedge segment 26 i.e. as shown in FIG. 5, member 105, retaining ring 106, drive shaft 102 and ratchet 63) is captivated in wedge segment 27 by the use of a resilient spring steel retaining ring 106 positioned in a groove 108 formed in sleeve member 105. Retaining ring 106 is installed in the groove 110 by compressing its outside diameter to the size of the opening in wedge segment 27. The operator with the compressed ring 106 is then pushed into the wedge segment 27, ring 106 then expanding into groove 110 to provide the captivating feature. A groove 110 is formed in the inner surface of wedge section 27 to receive a portion of the retaining ring 106 when the operator is installed within the wedge sections 12, 27 and 28. As set forth hereinabove, retaining ring 106 eliminates the roll pins utilized in the currently available Wedg-Tite assembly, thus reducing manufacturing costs and increasing reliability of the assembly.

A snap-ring 114 is positioned in a groove 116 formed at the end of the shaft 34 to captivate the assembly in contrast to the use of a nut or cross-pin, the snap-ring providing a cost efficient and quick captivation technique.

The improved operator can be quickly "snapped-in" to wedge segment 27 by using retaining ring 106.

The hex design (recess 104 and drive 102) reduces costs and is a more reliable design since they are formed by a single machine operation. The hex drive 102 is stronger than pin 66', the latter tending to shear after a period of use. The manufacturing costs of the cross pin design (slatting of sleeve 60', drilling of the pin hold and the pin installation) are time consuming and labor intensive, thus significantly increasing costs.

The present invention thus provides a simple, rapid and cost effective way of manufacturing and assembling a PCB locking wedge assembly.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A locking wedge apparatus for locking a printed circuit board within an elongated slot in a rack comprising:

a center wedge having sloped surfaces at its opposite ends;

first and second end wedges located at said opposite ends of the center wedge and having surfaces that engage the sloped surfaces of the center wedge;

a threaded shaft interconnecting the first and second end wedges, one end of said threaded shaft having a plurality of ratchet teeth formed thereon, rotation of the shaft in a first direction drawing the two end wedges toward each other such that the end wedges and interconnecting shaft are deflected transversely by the sloped surfaces of the center wedge to lock printed circuit board within said elongated slot, rotation of said shaft in a second direction to unlock said printed circuit board within said elongated slot;

a hex shaped member having a plurality of ratchet teeth formed on one end thereof, the ratchet teeth on said hex shaped member adapted to engage cooperating said ratchet teeth formed on said threaded shaft when said shaft is rotated in either said first or second directions;

a sleeve having an internal hex shaped recess, said hex shaped member extending in said recess; and a retaining ring, a portion of said retaining ring being positioned in a groove formed on an external surface of said sleeve and another portion of said ring extending into a groove formed in an inside diameter of said first end wedge whereby said sleeve is captivated within said first end wedge.

2. The apparatus of claim 1 further including a snap ring positioned at the other end of said threaded shaft to captivate said first, second and center wedges to the threaded shaft after the shaft has been rotated in the second direction to unlock the printed circuit board.

* * * * *